United States Patent
Choi et al.

[11] Patent Number: 5,986,947
[45] Date of Patent: Nov. 16, 1999

[54] CHARGE PUMP CIRCUITS HAVING FLOATING WELLS

[75] Inventors: Ki-Hwan Choi, Seoul; Seung-Keun Lee; Kang-Deog Suh, both of Kyunggi-do, all of Rep. of Korea

[73] Assignee: Samsung Electronics Co., Ltd., Rep. of Korea

[21] Appl. No.: 09/057,784

[22] Filed: Apr. 9, 1998

[30] Foreign Application Priority Data

Apr. 11, 1997 [KR] Rep. of Korea ......................... 97-13426
Dec. 29, 1997 [KR] Rep. of Korea ......................... 97-77268

[51] Int. Cl.$^6$ ..................................................... G11C 7/00
[52] U.S. Cl. ................................. 365/189.11; 365/185.18; 327/390; 327/589
[58] Field of Search .......................... 365/189.11, 185.18; 327/390, 589

[56] References Cited

PUBLICATIONS

Dickson, "On–Chip High–Voltage Generation in MNOS Integrated Circuits Using an Improved Voltage Multiplier Technique", IEEE Journal of Solid–State Circuits, vol. SC–11, No. 3, Jun. 1976, pp. 374–378.

*Primary Examiner*—David Nelms
*Assistant Examiner*—Hoai V. Ho
*Attorney, Agent, or Firm*—Myers Bigel Sibley & Sajovec

[57] ABSTRACT

The well regions of pumping units of charge pump circuits are maintained electrically floating. By maintaining the wells electrically floating, reduced impact from the body effect may be obtained. More specifically, integrated circuit charge pump circuits boost a first voltage from a voltage source to a second voltage at an output terminal. The charge pump circuits include a plurality of pumping units in an integrated circuit substrate of first conductivity type, that are serially connected between the voltage source and the output terminal. Each of the pumping units includes a well region of second conductivity type in the integrated circuit substrate of first conductivity type. The well region of second conductivity type is electrically floating. Each pumping unit also includes a transistor of the first conductivity type in the floating well region of second conductivity type, and a capacitor that is electrically connected to the transistor of the first conductivity type in the floating well region of second conductivity type.

15 Claims, 8 Drawing Sheets

CHARGE PUMP CIRCUITS HAVING FLOATING WELLS

FIELD OF THE INVENTION

This invention relates to integrated circuit devices, and more particularly to charge pump circuits that can be used to generate high voltages in integrated circuit devices.

BACKGROUND OF THE INVENTION

Integrated circuit charge pump circuits are widely used to provide boosted voltages in integrated circuits. These boosted voltages may be used, for example, to erase and program flash Electrically Erasable and Programmable Read Only Memories (flash EEPROMs).

There is a continuing trend toward lowering the power consumption in portable computers. Accordingly, the integrated circuits in personal computers are being designed to run at lower voltage levels, such as 5V, 3.3V or less. Unfortunately, some desirable features in portable computers may require higher voltages. For example, flash EEPROM has been used to store Basic Input/Output Startup (BIOS) programming for the personal computer. This flash EEPROM may be erased and reprogrammed without being removed from the computer by running a small update program when the BIOS program is to be changed. However, erasing and programming flash EEPROM generally requires up to 10V or more, which is generally not available from the lower voltage batteries that are provided in portable computers. Accordingly, a charge pump circuit may be used to produce the higher voltage from the lower voltage source. Charge pump circuits may also be used for other applications in integrated circuit memory devices and other integrated circuit devices.

A conventional charge pump circuit is disclosed in a publication entitled *"On-Chip High-Voltage Generation in NMOS Integrated Circuit Using Improved Voltage Multiplier Technique"* by Dickson, IEEE Journal of Solid-State Circuits, Vol. SC-11, No. 3, June 1976, pp. 374–378. FIG. 1 is a circuit diagram of charge pump circuits as disclosed in Dickson.

As shown in FIG. 1, the integrated circuit charge pump circuit boosts a first voltage from a voltage source Vcc to a second voltage Vpp at an output terminal T1. The charge pump circuit includes a plurality of pumping units that are serially connected between the voltage source and the output terminal. Each of the pumping units includes a coupling capacitor C1–Cn, and a switching NMOS enhancement transistor MN1–MNn. A precharging transistor MN0 connects the first voltage Vcc at terminal T2 to the pumping units. The drain region of each pumping transistor is electrically connected to its gate, and is also electrically connected to the source region of an immediately succeeding pumping unit. The bulk regions of the transistors MN1–MNn are held at ground.

As shown in FIG. 2, the pumping units are alternatively activated in response to pumping clocks P1 and P2, having complementary phases. Thus, P1 is applied to the odd-numbered capacitors C1, C3 . . . , and P2 is applied to the even-numbered capacitors C2, C4 . . . . Thus, initially, node N1 is charged to Vcc–Vth, where Vth is the threshold voltage of MN0. In response to the rising and falling of P1 and P2, voltage levels from N2 to T1 are stepwise increased to reach a level of Vpp.

Unfortunately, during the pumping operation, the voltage between the source and bulk region of each transistor, VSB, may gradually increase so that the source voltage rises while the bulk region is maintained at ground. This effect is often referred to as the "body" effect. As shown in FIG. 3, the source-to-bulk voltage VSB may increase from about 0V to about 3V, which may shift the gate voltage Vgs from 0.8V to 1.3V, for 0 drain-to-source current Ids. Threshold voltage Vt may thereby increase as shown in FIG. 3 in proportion to VSB. The shift in threshold voltage may degrade the efficiency of the charge pump circuit. Accordingly, a sufficiently high voltage for erasing and programming may not be obtained.

SUMMARY OF THE INVENTION

It is therefore an object of the invention to provide improved integrated circuit charge pump circuits and improved integrated circuits that use charge pump circuits.

It is another object of the present invention to provide charge pump circuits and integrated circuits that can reduce the performance impact due to the body effect.

These and other objects are provided according to the present invention, by maintaining the well regions of the pumping units of charge pump circuits electrically floating. By maintaining the wells electrically floating, reduced impact from the body effect may be obtained. The charge pumping circuits can thereby provide high voltage that may be used, for example, for programming and erasing operations in a flash EEPROM.

More specifically, integrated circuit charge pump circuits according to the invention boost a first voltage from a voltage source to a second voltage at an output terminal. The charge pump circuits include a plurality of pumping units in an integrated circuit substrate of first conductivity type, that are serially connected between the voltage source and the output terminal. Each of the pumping units comprises a well region of second conductivity type in the integrated circuit substrate of first conductivity type. The well region of second conductivity type is electrically floating. Each pumping unit also includes a transistor of the first conductivity type in the floating well region of second conductivity type, and a capacitor that is electrically connected to the transistor of the first conductivity type in the floating well region of second conductivity type.

The transistor preferably comprises spaced apart source and drain regions of the first conductivity type in the floating well region of the second conductivity type and an insulated gate on the floating well region, between the spaced apart source and drain regions. The insulated gate is electrically connected to the capacitor. The drain region is electrically connected to the gate electrode and is also electrically connected to the source region of an immediately succeeding pumping unit.

A plurality of discharge transistors may also be provided in the integrated circuit substrate. A respective discharge transistor electrically connects a respective floating well region of second conductivity type to a second voltage source in response to a control signal. A second transistor may also be provided that electrically connects the output terminal to a third voltage source in response to a second control signal.

Integrated circuit charge pump circuits according to the invention may be included in integrated circuit memory devices. For example, an integrated circuit memory device may include an array of integrated circuit memory cells arranged in a plurality of rows and columns in an integrated circuit substrate of first conductivity type. A row selection circuit is connected to the rows of the memory cells and a column selection circuit is connected to the columns of memory cells. A first charge pump unit is connected between a first voltage source and the row selection unit, and a second charge pump unit is connected between a second voltage source and the row selection circuit. Each of the charge pump units is as described above, with the conductivity types being reversed between the first and second charge pump units. Accordingly, a negative charge pump circuit provides a negative boosted voltage, and a positive charge pump circuit provides a positive boosted voltage. Improved performance, with reduced susceptibility to the body effect, may be provided.

DETAILED DESCRIPTION OF PREFERRED EMBODIMENTS

Figure 1:
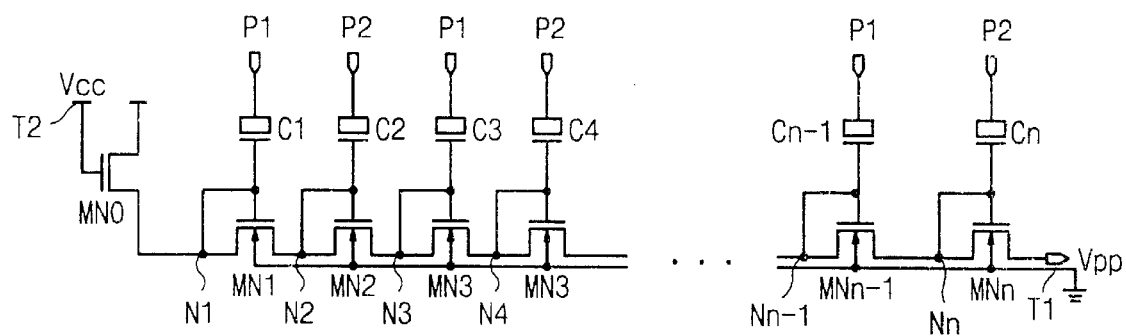
FIG. 1 is a circuit diagram of a conventional charge pump circuit.
Figure 2:
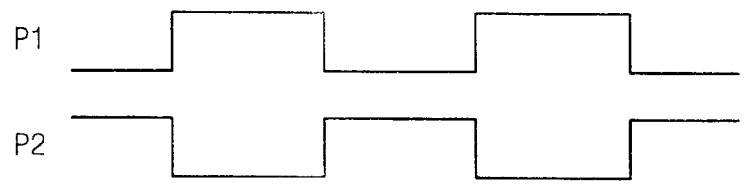
FIG. 2 is a timing diagram for the circuit of FIG. 2.
Figure 3:
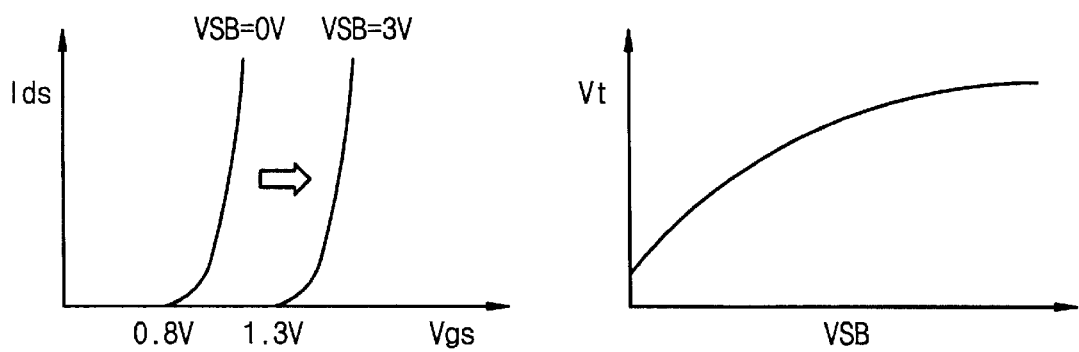
FIG. 3 graphically illustrates variation of threshold voltage resulting from the body effect.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. Moreover, each embodiment described and illustrated herein includes its complementary conductivity type embodiment as well.

Figure 4:
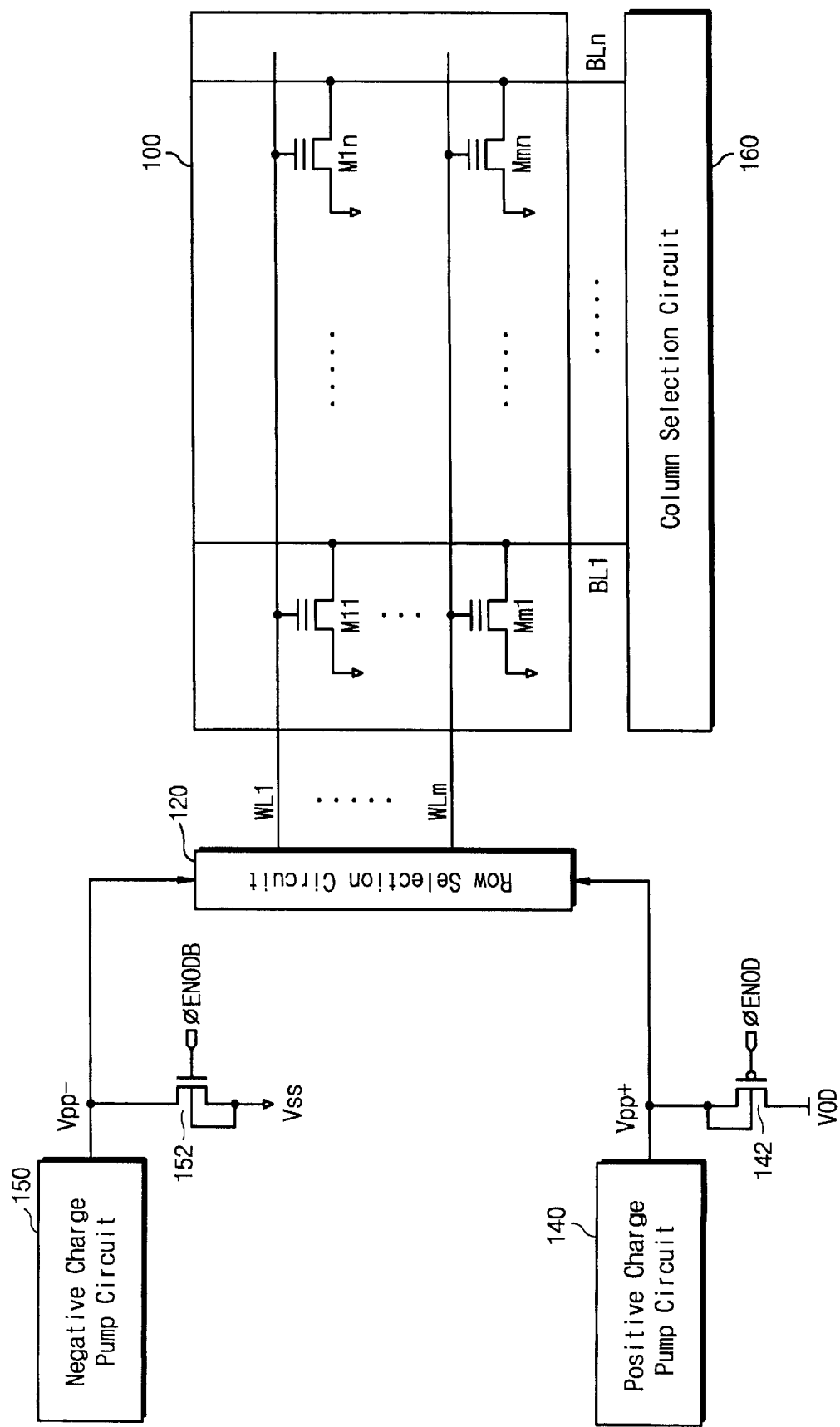
FIG. 4 is a schematic block diagram of integrated circuit nonvolatile memories which can utilize the present invention.

Referring now to FIG. 4, a block diagram of an integrated circuit memory device, such as a NOR-type flash EEPROM, which can use charge pump circuits according to the invention will now be described. As shown in FIG. 4, the integrated circuit memory device includes an array 100 of integrated circuit memory cells M11 . . . Mmn arranged in a plurality of rows and columns in an integrated circuit substrate of first conductivity type. It will be understood that the terms "row" and "column" are used to designate arbitrary designations, and these designations may be reversed.

Still referring to FIG. 4, row and column selection circuits 120 and 160 respectively each selects one of word lines WL1–WLm and one of bit lines BL1–BLn. Column selection circuit 160 connects a selected bit line to a corresponding sense amplifier.

As shown in FIG. 4, a negative charge pump circuit 150 and a positive charge pump circuit 140 are both connected to row selection circuit 120. Negative charge pump circuit 150 provides a boosted negative voltage Vpp− and positive charge pump circuit 140 provides a boosted positive voltage Vpp+. Row selection circuit 120, also referred to as a row decoder, activates all of the word lines with a negative high voltage Vpp− that is supplied from the negative charge pump circuit 150 during an erase cycle, so that memory cells can be erased. The positive charge pump circuit 140 supplies positive high voltage Vpp+ to row selection circuit 120 for programming and program verifying. The Vpp+ may be applied to a selected word line WL1 . . . WLm, by a switching operation of row selection circuit 120.

Still referring to FIG. 4, a PMOS transistor 142 includes a gate which is coupled to signal φENOD. The source and drain are coupled between voltage node VOD corresponding to the power supply voltage level Vcc, and the boosted power supply level Vpp+. Similarly, an NMOS transistor 152 includes a gate which is coupled to signal φENODB and includes source and drain which are serially coupled between Vss (ground) and the negative boosted supply voltage Vpp−. Transistor 142 pulls down the output terminal of Vpp+ to the level of Vcc before and after a pumping operation in response to activation of φENOD, and transistor 152 pulls the output terminal of Vpp− to the level of Vss before and after a pumping operation, in response to activation of φENODB.

Figure 5:
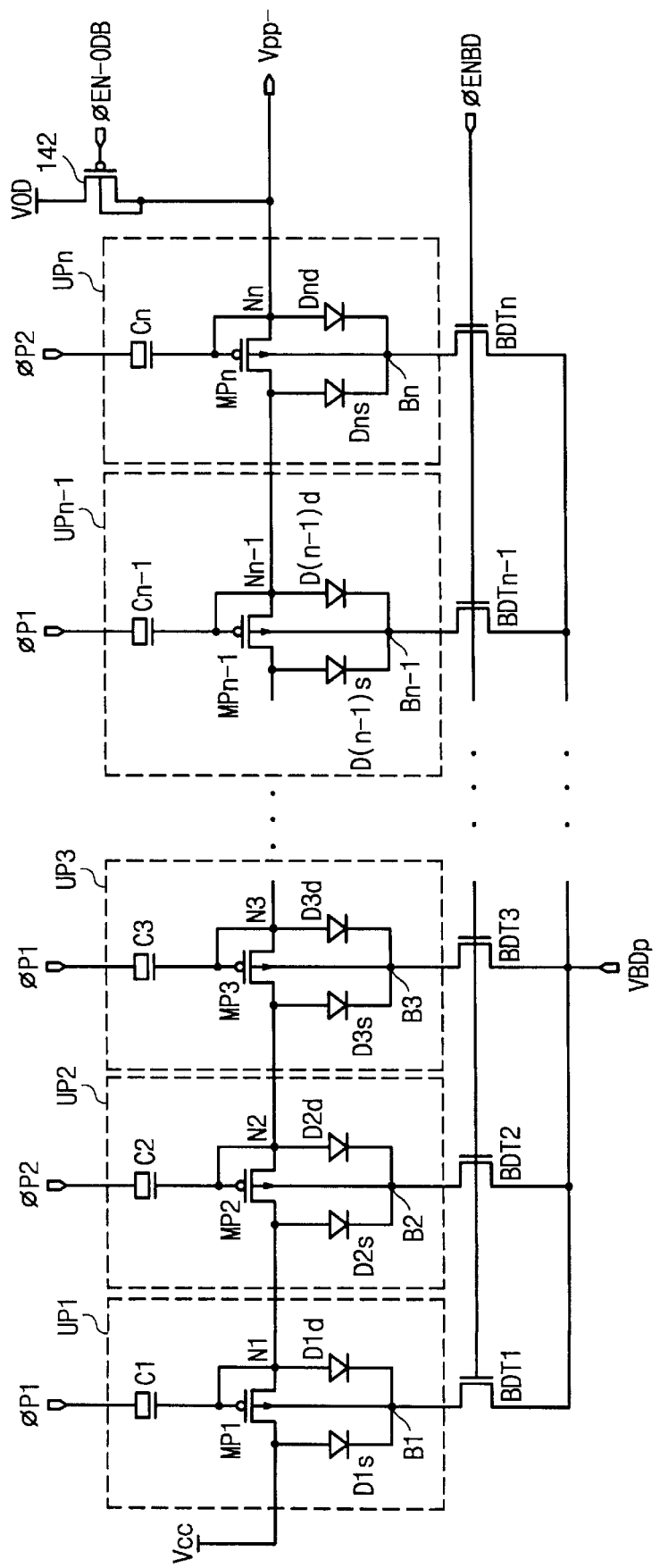
FIG. 5 is a circuit diagram of charge pump circuits which can be used in the integrated circuit of FIG. 4 according to the present invention.

An equivalent circuit of a positive charge pump circuit 140 for generating Vpp+ is shown in FIG. 5. Pumping units UP1 to UPn are connected in series from power supply voltage Vcc to the output terminal of Vpp+. Each pumping unit includes one coupling capacitor, one PMOS switching transistor and two parasitic diodes. Pumping units UP1~UPn have the same construction and are all connected to discharge voltage VBDp each through NMOS transistors BDT1~BDTn, the gates of which are coupled to discharge enable signal φENBD.

As an example, in the first pumping unit UP1, one electrode of capacitor C1 is coupled to pumping clock φP1 and the other electrode is connected to gate of PMOS transistor MP1 which is further connected to its drain node which defines a first pumping node N1. The source of transistor MP1, being connected to the power source voltage Vcc, is connected to bulk node B1 through parasitic diode D1s, while the drain of MP1 is connected to node B1 through parasitic diode D1d. Moreover, the bulk of MP1 is also connected to node B1. The parasitic diodes D1s and D1d are formed at the junctions between the source and drain active regions and the bulk region, which will be described in connection with FIG. 6 hereinafter. Discharge node B1 is connected to VBDp through transistor BDT1.

In pumping unit UP2 as a next boosting stage of the UP1, capacitor C2 responds to pumping clock φP2 which has the complementary phase compared to φP1. The other electrode of C2 is connected to gate of PMOS transistor MP2, the gate being connected to drain node N2 (also referred to as the second pumping node) thereof. Node N2 is connected to bulk node B2 through parasitic diode D2d. The source of MP2 is connected to B2 through parasitic diode D2s. As was the case with MP1, the bulk of MP2 is connected to B2 and the parasitic diodes D2s and D2d are formed each at the junctions of the source and drain sides. Bulk node B2 is connected to VBDp through transistor BDT2. The same construction of the pumping units are repeatedly arranged in series, forming a serial pumping chain. The pumping clocks φP1 and φP2 are alternately applied to the capacitors C1~Cn; φP1 to odd-numbered pumping units and φP2 to even-numbered units. Finally, as disclosed in FIG. 4, PMOS precharge transistor 142 is connected to the output terminal of Vpp+.

Figure 6:
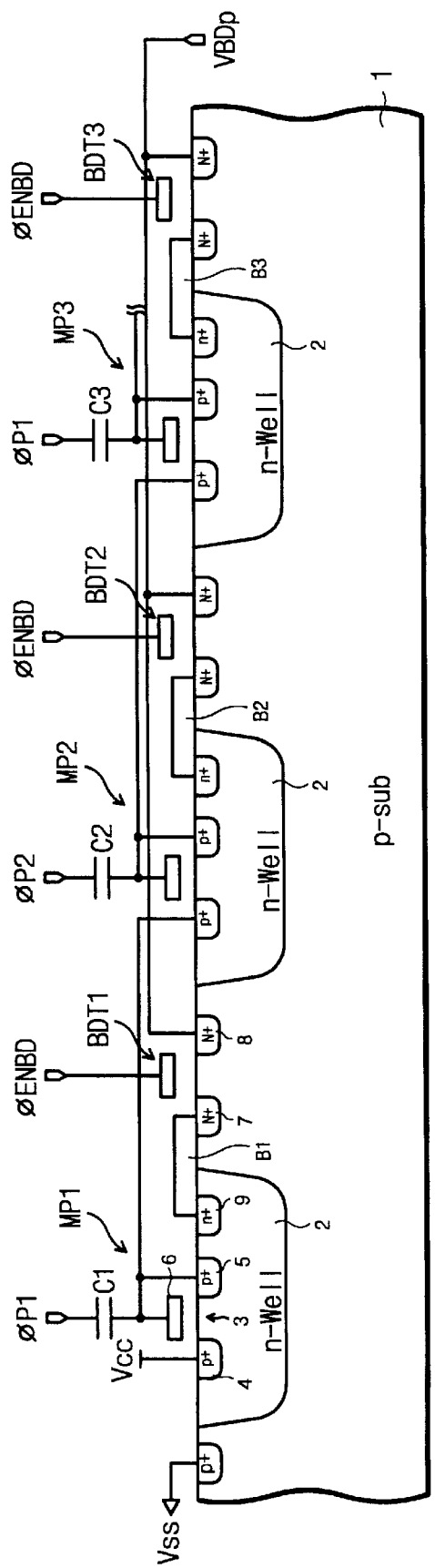
FIG. 6 is a cross-section of an integrated circuit including a charge pump of FIG. 5.

FIG. 6 schematically shows a cross-sectional configuration of an integrated circuit including the pumping units and discharge transistors of FIG. 5. The switching transistors, MP1 through MPN, are each formed in their own N– (lightly doped N-type) wells 2 which act as bulk regions of the transistors. N-wells 2 are defined in P– (lightly doped p-type) substrate 1 and are electrically isolated therein. The substrate 1 is connected to Vss (e.g., 0V) through P+ (heavily doped P-type) region. In each well 2, P+ active regions are formed to become the source and drain, and N+ (heavily doped N-type) active region 9 is formed to be used in receiving a well bias voltage if desired. N+ active regions 7 and 8, the drain and source of the discharge transistor such as BDT1, are defined in P-substrate 1. The N+ regions 8 of the discharge transistors are connected in common to the discharge voltage VBDp.

N+ region 7, the drain of the discharge transistor such as BDT1, is directly connected to the N+ region in N– well (or to the bulk of the switching transistor in the pumping unit) 2 through the node B1. The N– well is not coupled to any other bias voltage, so that it is in a floating state. Since there is no supply of bias voltage to the N– well (the bulk of the switching transistor of the pumping unit), two lateral junctions between P+ region 4 and N+ region 9, and P+ region 5 and N+ region 9 are formed to produce the two parasitic diodes such as D1s and D1d of which the cathodes are connected to VBDp through node B1 and the channel path of BDT1. As well known, the diodes can retain predetermined values of threshold voltage and can pass current from the source and drain regions to B1 in order to maintain their own voltage difference between the anodes and cathodes.

Figure 7:
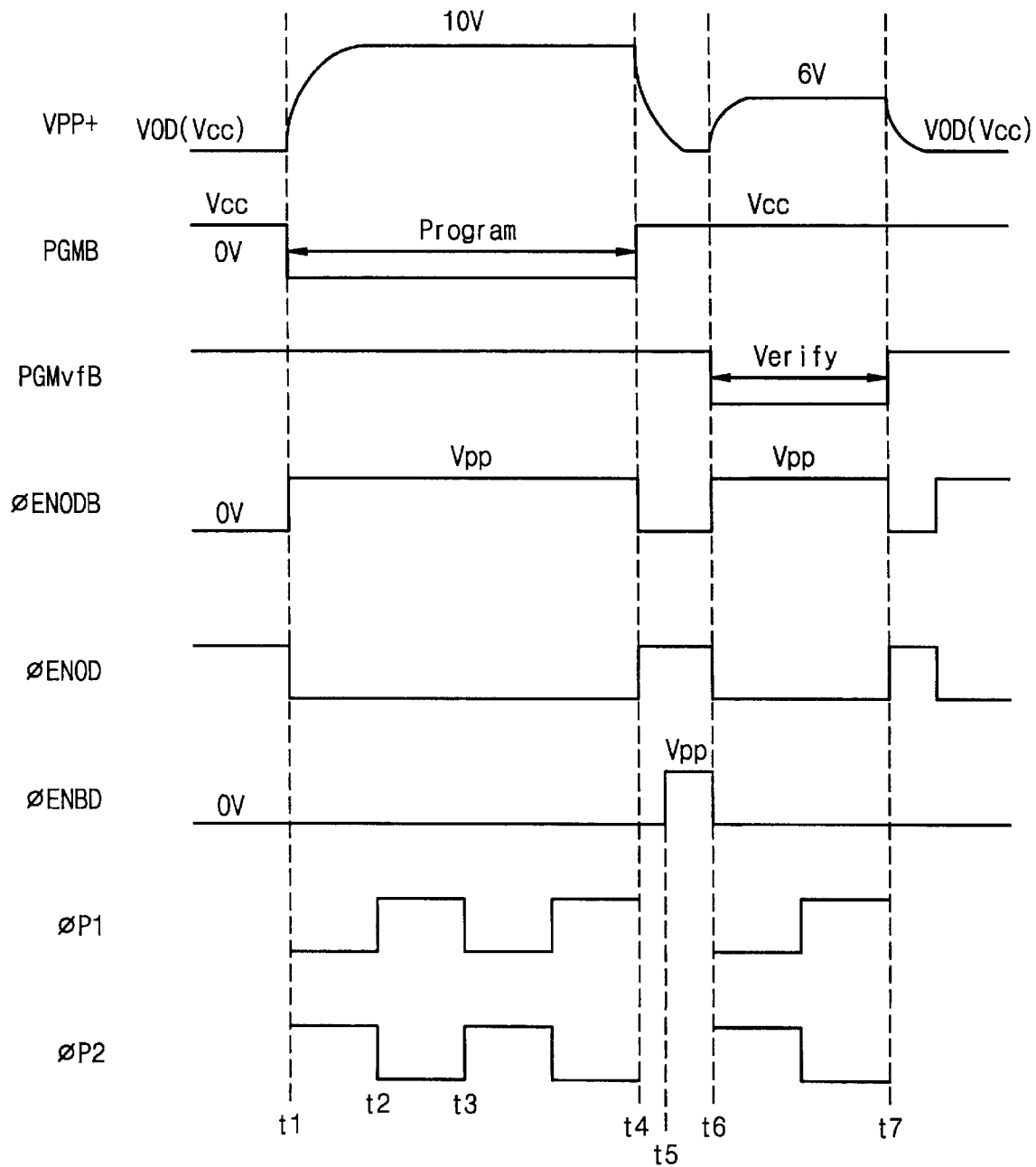
FIG. 7 is a timing diagram for the operations of a charge pump of FIG. 5.

Referring now to FIG. 7, the pumping operation in the circuit of FIG. 5 (or the structure of FIG. 6) will be described in detail. In FIG. 7, PGMB is a signal for activating a programming operation and PGMvfB permits program verifying mode. First, while precharge signal φENOD is low, the output terminal of Vpp+, i.e. the output terminal of the positive charge pump circuit 140, is set into the precharge level of VOD (level of Vcc) because the precharge transistor 142 switches on. Next, if PGMB goes low at time t1, the circuit starts to boost Vpp+, for example up to a level of about 10V as a programming voltage, in response to φP1 and φP2.

At this time, voltage at bulk node B1 of switching transistor MP1 becomes Vcc–Vtd, where Vtd is threshold voltage of D1s, and node N1 is charged up to Vcc–Vtp1, where Vtp1 is threshold voltage of MP1. Since Vtp1 is generally higher than Vtd, D1d is not conductive and the voltage of node N1 maintains the present level so that φP2 being high shuts down MP2 when φP1 is low. At t2 when φP1 goes high and φP2 falls to low, MP1 and MP2 switch off and on, respectively. This condition can generate an equation for the voltage at node N1, Vn1, as follows:

$$Vn1 = (Vcc - Vtp1) + \alpha \times Vcc, \qquad [1]$$

where $\alpha = C1/(C1+C1')$ and $C1'$ is capacitance at node N1. The voltage of node N2, Vn2, is as follows:

$$Vn2 = (Vcc - Vtp1) + \alpha \times Vcc - Vtp2, \qquad [2]$$

where Vtp2 is threshold voltage of MP2. During the time from t2 to t3, the switching-off of MP1 prevents current flow from node N1 to Vcc and bulk node B2 is charged up to the voltage of Vn1–Vtd, VB2, which is the value reduced from Vn1 by Vtd, i.e.:

$$VB2 = (Vcc - Vtp1) + \alpha \times Vcc - Vtd. \qquad [3]$$

As shown in equations [2] and [3], during the pumping operation, the voltage VSB between the N– well 2 (bulk of MP1) and P+ active region 4 (source of MP1) maintains Vtd the threshold voltage of the parasitic diode DIs (I from one of 1 through n). Thus, the positive high voltage Vpp+ becomes:

$$Vpp+ = Vcc + n \times (\alpha Vcc - |Vtp|). \qquad [4]$$

During the programming cycle, the discharge signal φENBD and the precharge signal φENODB are held at a predetermined high voltage Vpp and at low level, respectively. If a programming operation using Vpp+ of about 10V is over at t4, the precharge signal φENODB goes low to pull down the present level of Vpp+ to the level of VOD, for the purpose of preparing for a subsequent program verifying operation, and φP1 and φP2 are disabled until the program verifying cycle begins.

Even though VSB is set at the level of Vtd during the boosting operation, an increase of the bulk voltage can be avoided because the potential of the n– well (bulk region) rises in proportion to an increase of the voltage of the source of the switching transistor, with the difference of Vtd therefrom. This bulk potential can be over the source potential of the switching transistor, which can result in reduced boosting efficiency of the circuit. For that reason, at time t5, the discharge signal φENBD goes to a high voltage Vpp to switch the transistors BDT1~BDTn on. The boosted potential at the bulk regions of the switching transistors is thereby lowered to that of VBDp. For example, the bulk voltage is discharged to VBDp of 0V.

If PGMvfB goes low at t6 to start the program verifying cycle, φP1 and φP2 are again activated and Vpp+, for example about 6V, is generated from the positive charge pump circuit 140. It is well known that the level of Vpp+ can be adjusted by controlling the number of cycles of the pumping clocks φP1 and φP2. After finishing the program verifying operation, in order to precharge the output terminal of Vpp+, φENODB goes low as in the programming period. It is possible to activate φENBD in the same manner with the case of the programming operation, if needed.

Figure 8:
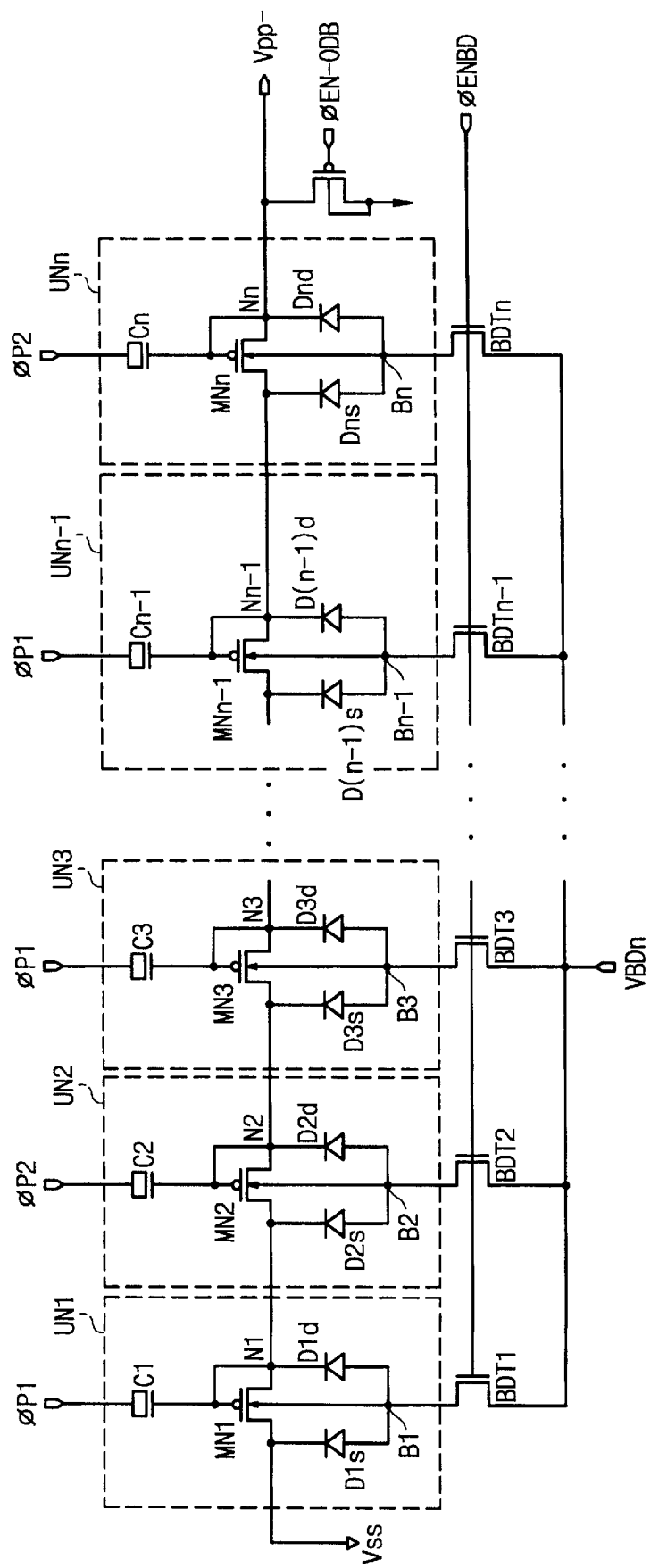
FIG. 8 is a schematic diagram of second charge pump circuits that can be used in the integrated circuit of FIG. 4, according to the present invention.
Figure 9:
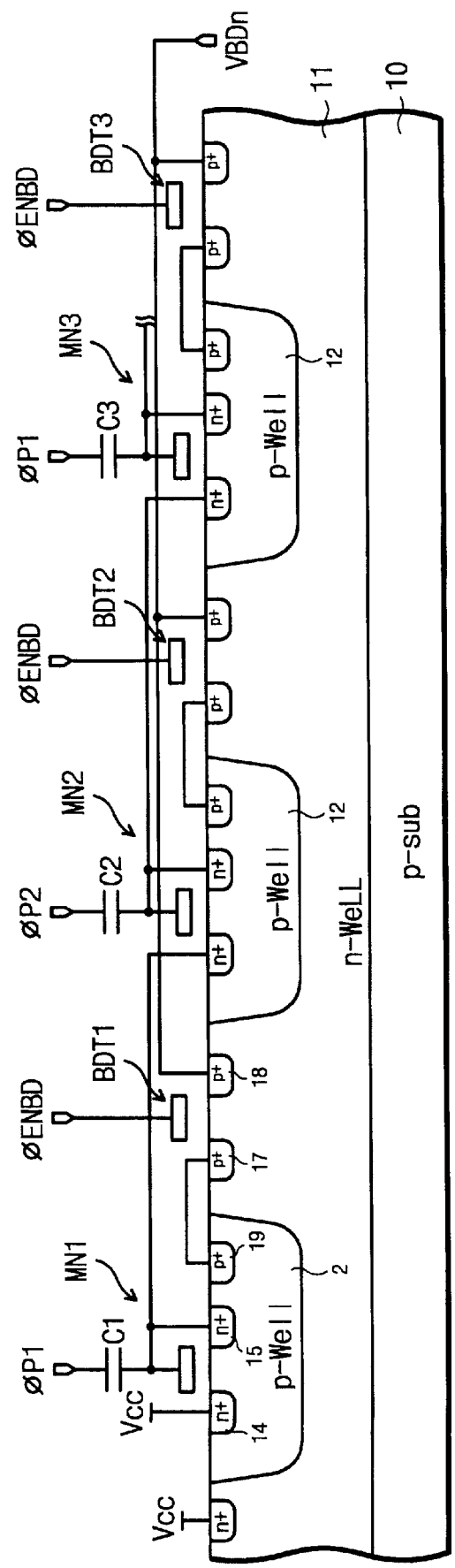
FIG. 9 is a cross-section of an integrated circuit including a charge pump of FIG. 8.

FIGS. 8 and 9 shows an equivalent circuit construction and a cross-sectional schematic, of a negative charge pump circuit 150 for generating a negative high voltage Vpp– which can be utilized in erasing and erase verifying. Pumping units UN1 to UNn are connected in series from substrate voltage Vss to the output terminal of Vpp–. Each pumping unit includes one coupling capacitor, one NMOS switching transistor and two parasitic diodes. Pumping units UN1~UNn have the same construction and are all connected to discharge voltage VBDn each through NMOS transistors BDT1~BDTn, the gates of which are coupled to discharge enable signal φENBD.

As an example, in the first pumping unit UP1, one electrode of capacitor C1 is coupled to pumping clock φP1 and the other electrode is connected to gate of NMOS transistor MN1 which is further connected to its drain node which defines a first pumping node N1. The source of transistor MN1, being connected to Vss, is connected to bulk node B1 through parasitic diode D1s, while the drain of MN1 to node B1 is connected through parasitic diode D1d. Moreover, the bulk of MN1 is also connected to node B1. The parasitic diodes D1s and D1d are formed at the junctions between the source and drain active regions and the bulk region, which will be apparently described in connection with FIG. 9 hereinafter. Discharge node B1 is connected to VBDn through transistor BDT1.

In pumping unit UN2 as a next boosting stage of the UN1, capacitor C2 responds to pumping clock φP2 which has the complementary phase compared φP1. The other electrode of C2 is connected to gate of NMOS transistor MN2, the gate being connected to drain node N2 (also referred to as the second pumping node) thereof. Node N2 is connected to bulk node B2 through parasitic diode D2d. The source of MN2 is connected to B2 through parasitic diode D2s. As was the case with MN1, the bulk of MN2 is connected to B2 and the parasitic diodes D1s and D2d are formed each at the junctions of the source and drain sides. Bulk node B2 is connected to VBDn through transistor BDT2. The same construction of the pumping units are repeatedly arranged in series, forming a serial pumping chain. The pumping clocks φP1 and φP2 are alternately applied to the capacitors C1~Cn; φP1 to odd-numbered pumping units and φP2 to even-numbered units. Finally, as disclosed in FIG. 4, NMOS precharge transistor 152 is connected between the output terminal of Vpp− and Vss.

FIG. 9 schematically shows a cross-sectional configuration of an integrated circuit including the pumping units and discharge transistors of FIG. 8. The switching transistors, MN1 through MNn, are each formed in their own P− wells 12 which act as bulk regions of the transistors. P-wells 12 are defined in N− well 11 in P-substrate 10 and are electrically isolated therein. The N− well 11 is connected to Vcc through N+ region. In each well 12, N+ active regions 14 and 15 are formed to become the source and drain, and P+ active region 19 is formed to be used in receiving a well bias voltage. P+ active regions 17 and 18, the drain and source of the discharge transistor such as BDT1, are defined in the N-well 12. The N+ regions 18 of the discharge transistors are connected in common to the discharge voltage VBDn.

P+ region 17, the drain of the discharge transistor such as BDT1, is directly connected to the P+ region in P− well (or to the bulk of the switching transistor in the pumping unit) 12 through the node B1. The P− well is not coupled to any other bias voltage, so that it is in a floating state. Since there is no supply of bias voltage to the P− well (the bulk of the switching transistor of the pumping unit), two lateral junctions between P+ region 19, N+ regions 14 and 15, respectively, are formed to produce the two parasitic diodes such as D1s and D1d of which the cathodes are connected to VBDn through node B1 and the channel path of BDT1. The diodes can retain predetermined values of threshold voltage between the P− well 12 (bulk) and the N+ active regions 14 and 15 (source and drain), maintaining their own voltage difference between the anodes (bulk) and cathodes (source and drain).

The pumping operation in the circuit of the negative charge pump circuit 150 is carried out in the same manner as that of the positive charge pump circuit 140, except that Vpp− for erasing may be about −12V while Vpp+ may be about 10V. In FIG. 7, for the erase operation, the programming signal PGMB and program verifying signal PGMvfB correspond to an erase signal (e.g., ERSB) and an erase verifying signal (e.g., ERSvfB), respectively, and the precharge signal φENOD applied to gate of transistor 152 is set into high before and after the erase cycle or the erase verifying cycle as φENODB does for the programming operation. The signal φENBD and the discharge transistors BDT1~BDTn can enhance the boosting efficiency as described above, in which VBDn becomes a source to discharge the increased potential of the bulk of the switching transistors thereto. In this case, the VBDn is preferred to be the voltage level of Vcc, for instance.

Accordingly, the invention can reduce effects due to the increase of bulk-to-source voltage or the body effect and can enhance boosting efficiency in a charge pump circuits employing a pumping chain.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An integrated circuit charge pump circuit that boosts a first voltage from a voltage source to a second voltage at an output terminal, the charge pump circuit comprising:
   a plurality of pumping units in an integrated circuit substrate of first conductivity type that are serially connected between the voltage source and the output terminal, each of the pumping units comprising:
   a well region of second conductivity type in the integrated circuit substrate of first conductivity type, the well region of second conductivity type being electrically floating;
   a transistor of the first conductivity type in the floating well region of second conductivity type; and
   a capacitor that is electrically connected to the transistor of the first conductivity type in the floating well region of second conductivity type.

2. The integrated circuit charge pump circuit according to claim 1 wherein the transistor comprises:
   spaced apart source and drain regions of the first conductivity type in the floating well region of the second conductivity type; and
   an insulated gate on the floating well region, between the spaced apart source and drain regions, the insulated gate being electrically connected to the capacitor.

3. The integrated circuit charge pump circuit according to claim 2 wherein the drain region is electrically connected to the gate electrode and is electrically connected to the source region of an immediately succeeding pumping unit.

4. The integrated circuit charge pump circuit according to claim 1 further comprising:
   a plurality of discharge transistors in the integrated circuit substrate, a respective one of which electrically connects a respective floating well region of second conductivity type to a second voltage source, in response to a control signal.

5. The integrated circuit charge pump according to claim 1 further comprising:
   a second transistor that electrically connects the output terminal to a third voltage source, in response to a second control signal.

6. An integrated circuit charge pump circuit, comprising:

a well region of second conductivity type in an integrated circuit substrate of first conductivity type, the well region of second conductivity type being electrically floating;

a transistor of the first conductivity type in the floating well region of second conductivity type; and a capacitor that is electrically connected to the transistor of the first conductivity type in the floating well region of second conductivity type.

7. The integrated circuit charge pump circuit according to claim 6 wherein the transistor comprises:

spaced apart source and drain regions of the first conductivity type in the floating well region of the second conductivity type; and an insulated gate on the floating well region, between the spaced apart source and drain regions, the insulated gate being electrically connected to the capacitor.

8. The integrated circuit charge pump circuit according to claim 7 wherein the drain region is electrically connected to the gate electrode.

9. The integrated circuit charge pump circuit according to claim 6 further comprising:

a discharge transistor in the integrated circuit substrate, which electrically connects the floating well region of second conductivity type to a second voltage source, in response to a control signal.

10. The integrated circuit charge pump according to claim 6 further comprising:

a second transistor that electrically connects the drain region to a third voltage source, in response to a second control signal.

11. An integrated circuit memory device comprising:

an array of integrated circuit memory cells arranged in a plurality of rows and columns in an integrated circuit substrate of first conductivity type;

a row selection circuit connected to the rows of memory cells;

a column selection circuit connected to the columns of memory cells;

a first charge pump unit connected between a first voltage source and the row selection unit; and a second charge pump unit connected between a second voltage source and the row selection unit;

the first charge pump unit comprising a plurality of first pumping units in the integrated circuit substrate of first conductivity type that are serially connected between the first voltage source and the row selection unit, each of the first pumping units comprising a well region of second conductivity type in the integrated circuit substrate of first conductivity type, the well region of second conductivity type being electrically floating, a first transistor of the first conductivity type in the floating well region of second conductivity type, and a first capacitor that is electrically connected to the first transistor of the first conductivity type in the floating well region of second conductivity type;

the second charge pump unit comprising a plurality of second pumping units in the integrated circuit substrate of first conductivity type that are serially connected between the second voltage source and the row selection unit, each of the second pumping units comprising a well region of first conductivity type in the integrated circuit substrate of first conductivity type, the well region of first conductivity type being electrically floating, a second transistor of the second conductivity type in the floating well region of first conductivity type, and a first capacitor that is electrically connected to the second transistor of the second conductivity type in the floating well region of first conductivity type.

12. The integrated circuit charge pump circuit according to claim 11:

wherein the first transistor comprises spaced apart source and drain regions of the first conductivity type in the floating well region of the second conductivity type, and an insulated gate on the floating well region, between the spaced apart source and drain regions, the insulated gate being electrically connected to the first capacitor; and wherein the second transistor comprises spaced apart source and drain regions of the second conductivity type in the floating well region of the first conductivity type, and an insulated gate on the floating well region, between the spaced apart source and drain regions, the insulated gate being electrically connected to the second capacitor.

13. The integrated circuit charge pump circuit according to claim 12 wherein in each of the first and second charge pump units, the drain region is electrically connected to the gate electrode and is electrically connected to the source region of an immediately succeeding pumping unit.

14. The integrated circuit charge pump circuit according to claim 11:

wherein the first charge pump unit further comprises a plurality of first discharge transistors in the integrated circuit substrate, a respective one of which electrically connects a respective floating well region of second conductivity type to a third voltage source, in response to a first control signal; and wherein the second charge pump unit further comprises a plurality of second discharge transistors in the integrated circuit substrate, a respective one of which electrically connects a respective floating well region of first conductivity type to a fourth voltage source, in response to a second control signal.

15. The integrated circuit charge pump according to claim 11:

wherein the first charge pump unit further comprises a third transistor that electrically connects the output terminal to a third voltage source, in response to a third control signal; and wherein the second charge pump unit further comprises a fourth transistor that electrically connects the output terminal to a fourth voltage source, in response to a fourth control signal.

* * * * *

UNITED STATES PATENT AND TRADEMARK OFFICE
CERTIFICATE OF CORRECTION

PATENT NO. : 5,986,947
DATED : November 16, 1999
INVENTOR(S) : Choi et al.

It is certified that error appears in the above-identified patent and that said Letters Patent is hereby corrected as shown below:

On the title page,
[56] References Cited - Please add the following:

| | | | |
|---|---|---|---|
| 5,812,018 | 9/98 | Sudo et al. | 327/537 |
| 5,313,429 | 5/94 | Chevallier et al. | 365/226 |
| 4,061,929 | 12/77 | Asano | 327/589 |

Signed and Sealed this

Sixteenth Day of May, 2000

Attest:

Q. TODD DICKINSON

*Attesting Officer*  *Director of Patents and Trademarks*